United States Patent
Sandhu et al.

(10) Patent No.: US 7,189,317 B2
(45) Date of Patent: Mar. 13, 2007

(54) SEMICONDUCTOR MANUFACTURING SYSTEM FOR FORMING METALLIZATION LAYER

(75) Inventors: Gurtej Singh Sandhu, Boise, ID (US); Chris Chang Yu, Aurora, IL (US)

(73) Assignee: Micron Technology, Inc., Boise, ID (US)

( * ) Notice: Subject to any disclaimer, the term of this patent is extended or adjusted under 35 U.S.C. 154(b) by 526 days.

(21) Appl. No.: 10/217,618

(22) Filed: Aug. 13, 2002

(65) Prior Publication Data

US 2003/0032279 A1    Feb. 13, 2003

Related U.S. Application Data

(60) Division of application No. 09/652,619, filed on Aug. 31, 2000, which is a continuation of application No. 08/912,051, filed on Aug. 18, 1997, now Pat. No. 6,144,095, which is a continuation of application No. 08/656,712, filed on Jun. 3, 1996, now Pat. No. 5,662,788.

(51) Int. Cl.
*C25D 5/00*    (2006.01)

(52) U.S. Cl. .......................... 205/80; 205/123

(58) Field of Classification Search ............... 205/80, 205/99, 105, 123, 157, 159, 219
See application file for complete search history.

(56) References Cited

U.S. PATENT DOCUMENTS

| | | | |
|---|---|---|---|
| 4,624,749 A * | 11/1986 | Black et al. .................. 205/50 |
| 4,884,123 A | 11/1989 | Dixit et al. .................. 357/71 |
| 5,017,271 A | 5/1991 | Whewell et al. ............. 204/15 |
| 5,032,233 A | 7/1991 | Yu et al. ................. 204/192.28 |
| 5,066,611 A | 11/1991 | Yu ............................. 437/173 |
| 5,151,168 A | 9/1992 | Gilton et al. ................ 205/123 |
| 5,188,723 A | 2/1993 | Yu et al. ..................... 205/125 |
| 5,222,329 A | 6/1993 | Yu ............................ 51/281 R |
| 5,243,220 A | 9/1993 | Shibata et al. .............. 257/748 |
| 5,256,274 A | 10/1993 | Poris ......................... 205/123 |
| 5,277,985 A | 1/1994 | Li et al. ..................... 428/432 |
| 5,310,602 A | 5/1994 | Li et al. ..................... 428/432 |
| 5,317,193 A | 5/1994 | Watanabe ................... 257/774 |
| 5,336,391 A | 8/1994 | Rice .......................... 205/152 |
| 5,344,792 A | 9/1994 | Sandhu et al. ............. 437/200 |
| 5,366,929 A | 11/1994 | Cleeves et al. ............. 437/195 |
| 5,378,310 A | 1/1995 | Satoh et al. ................ 156/643 |
| 5,380,679 A | 1/1995 | Kano ......................... 437/192 |

(Continued)

*Primary Examiner*—David Vu
(74) *Attorney, Agent, or Firm*—Schwegman, Lundberg, Woessner & Kluth, P.A.

(57) ABSTRACT

A method for forming a metallization layer. A first layer is formed outwardly from a semiconductor substrate. Contact vias are formed through the first layer to the semiconductor substrate. A second layer is formed outwardly from the first layer. Portions of the second layer are selectively removed such that the remaining portion of the second layer defines the layout of the metallization layer and the contact vias. The first and second layers are electroplated by applying a bi-polar modulated voltage having a positive duty cycle and a negative duty cycle to the layers in a solution containing metal ions. The voltage and surface potentials are selected such that the metal ions are deposited on the remaining portions of the second layer. Further, metal ions deposited on the first layer during a positive duty cycle are removed from the first layer during a negative duty cycle. Finally, exposed portions of the first layer are selectively removed.

39 Claims, 2 Drawing Sheets

U.S. PATENT DOCUMENTS

| | | |
|---|---|---|
| 5,381,040 A | 1/1995 | Sun et al. .................... 257/774 |
| 5,530,418 A | 6/1996 | Hsu et al. ................... 338/307 |
| 5,545,926 A | 8/1996 | Kohyama et al. ........... 257/755 |
| 5,691,571 A | 11/1997 | Hirose et al. ................ 257/751 |
| 5,719,446 A | 2/1998 | Taguchi et al. ............. 257/751 |
| 5,739,579 A | 4/1998 | Chiang et al. ............... 257/635 |
| 5,824,599 A | 10/1998 | Schacham-Diamand et al. .......................... 438/678 |
| 5,851,367 A | 12/1998 | Nguyen et al. ......... 204/192.34 |
| 6,143,593 A | 11/2000 | Augusto ..................... 438/199 |
| 6,290,833 B1 | 9/2001 | Chen ......................... 205/182 |
| 6,369,430 B1 | 4/2002 | Adetutu et al. ............. 257/382 |

* cited by examiner

SEMICONDUCTOR MANUFACTURING SYSTEM FOR FORMING METALLIZATION LAYER

This application is a Divisional of U.S. application Ser. No. 09/652,619, filed Aug. 31, 2000, which is a Continuation of U.S. application Ser. No. 08/912,051, filed Aug. 18, 1997, now U.S. Pat. No. 6,144,095, which is a Continuation of U.S. application Ser. No. 08/656,712, filed Jun. 3, 1996, now U.S. Pat. No. 5,662,788.

TECHNICAL FIELD OF THE INVENTION

The present invention relates generally to integrated circuits and, in particular, to a method for forming a metallization layer.

BACKGROUND OF THE INVENTION

An integrated circuit comprises a large number of semiconductor devices, such as transistors, that are formed on a semiconductor substrate or, more colloquially, a "chip." These devices are selectively interconnected by one or more patterned layers of a conductive material, typically aluminum, to form a circuit that performs a desired function. These layers are referred to as "metallization" layers. As integrated circuits become more complex, designers reduce the minimum feature size of the constituent devices of the circuit, so as to fit more devices on a chip. With this reduction in size, it becomes more difficult to achieve proper pattern definition using conventional techniques such as photolithography and dry etch techniques for forming metallization layers. Further, designers have attempted to use copper instead of aluminum as the principle metallization material in the metallization layers, due to perceived advantages in resistivity, ductility and melting point. Unfortunately, developers have not been able to create a reliable technique for patterning a copper layer.

For example, one process using electro-deposition for forming a copper metallization layer is described in U.S. Pat. No. 5,151,168. According to this process, a conductive barrier layer is deposited on a semiconductor substrate. Further, a photoresist reverse image of the maskwork normally used to etch the metallization pattern is created on the substrate. The wafer is then transferred to an electrolytic bath in which the copper is complexed with EDTA molecules. A fixed voltage is applied between a voltage source and the semiconductor substrate to deposit the copper ions on the barrier layer that is not covered by the photoresist layer including contact/via openings on the semiconductor substrate. Unfortunately, when the substrate is placed in the electrolytic bath, the photoresist material may lift-off from the substrate thus depositing copper in areas where it is not required.

For the reasons stated above, and for other reasons stated below which will become apparent to those skilled in the art upon reading and understanding the present specification, there is a need in the art for a method for forming a metallization layer that avoids the disadvantages and problems of prior techniques.

SUMMARY OF THE INVENTION

A method for forming a metallization layer is described which uses a single electro-deposition step to reliably form both the metallization layer and to fill the contact vias. In particular, one embodiment of the present invention uses first and second layers of materials that are placed at different surface potentials to form the metallization layer. The first layer is formed outwardly from a semiconductor substrate. Contact vias are formed through the first layer to the semiconductor substrate. The second layer is formed outwardly from the first layer. Portions of the second layer are selectively removed such that the remaining portion of the second layer defines the layout of the metallization layer and the contact vias. Metal ions in a solution are electro-deposited by applying a bi-polar modulated voltage having a positive duty cycle and a negative duty cycle to the layers and the solution. The voltage and surface potentials are selected such that the metal ions are deposited on the remaining portions of the second layer. Further, metal ions deposited on the first layer during a positive duty cycle are removed from the first layer during a negative duty cycle. Finally, exposed portions of the first layer are selectively removed.

In another embodiment of the present invention, the first and second layers are placed at different surface potentials by applying a first voltage to a surface of the first layer and applying a second voltage, higher than the first voltage, to the second layer. In another embodiment of the present invention the different surface potentials are achieved in part by selecting materials for the first and second layers that have different innate surface potentials.

DETAILED DESCRIPTION OF THE INVENTION

In the following detailed description of the invention, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be used and that logical, mechanical and electrical changes may be made without departing from the spirit and scope of the present invention. The following detailed description is, therefore, not to be taken in a limiting sense.

FIGS. 1A through 1D are cross-sectional views of semiconductor substrate 10 that depict process steps according to an illustrative embodiment of the present invention. Advantageously, the illustrative embodiment forms a metallization layer, including filling contact vias, outwardly from semiconductor substrate 10 in a single electro-deposition step. The process exposes adjacent layers of materials that are formed outwardly from semiconductor substrate 10 with different surface potentials to a bi-polar modulated voltage source to deposit the metallization layer and to fill the contact vias. The surface potentials and the modulated voltage are selected such that the metallization layer forms only on the second layer because metal that deposits on the first layer during a first duty cycle of the bi-polar modulated voltage is removed from the first layer during a second duty cycle.

Figure 1A:
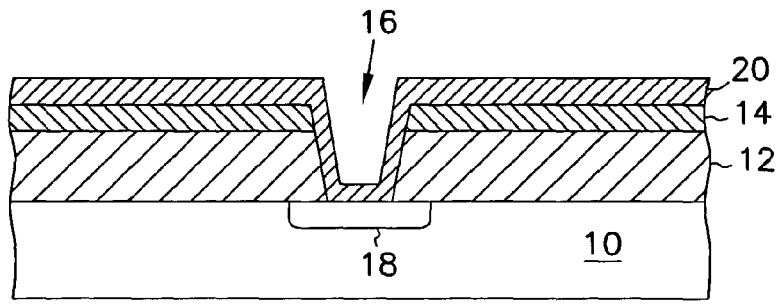
FIGS. 1A through 1D are cross-sectional views of a semiconductor substrate that illustrate process steps according to an illustrative embodiment of the present invention.

As shown in FIG. 1A, borophosphosilicate glass (BPSG) layer 12 is deposited and reflowed outwardly from semiconductor substrate 10. First layer 14 is formed outwardly from BPSG layer 12. First layer 14 may comprise, for example, poly-silicon, doped or undoped, that is deposited using a conventional chemical vapor deposition (CVD) or sputtering technique. Alternatively, other materials such as germanium may be substituted for the poly-silicon. Contact via 16 is etched through first layer 14 and BPSG layer 12 to, for example, junction 18 of semiconductor substrate 10. Second layer 20 is formed outwardly from first layer 14 so as to line contact via 16 and cover first layer 14 by, for example, depositing a layer of titanium nitride or other appropriate barrier layer material using a conventional sputter or chemical vapor deposition technique. First layer 14 and second layer 20 have a thickness on the order of 100 to 500 Å. Advantageously, the innate surface potential of first layer 14 is lower than the innate surface potential of second layer 20. This difference in surface potentials contributes to the selectivity of the electro-deposition step described below. In other embodiments, first and second layers 14 and 20 can be fabricated from other materials that provide similar differences in innate surface potential.

Figure 1B:
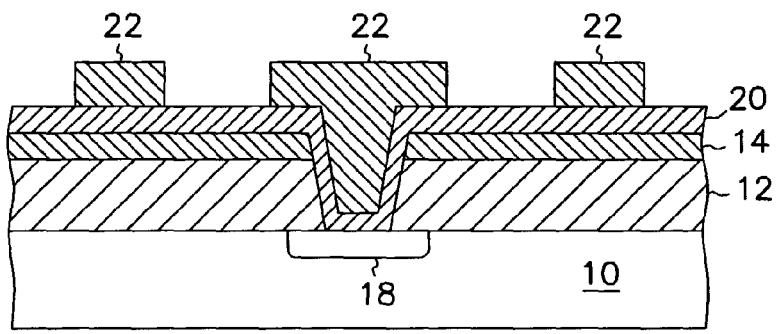
Figure 1C:
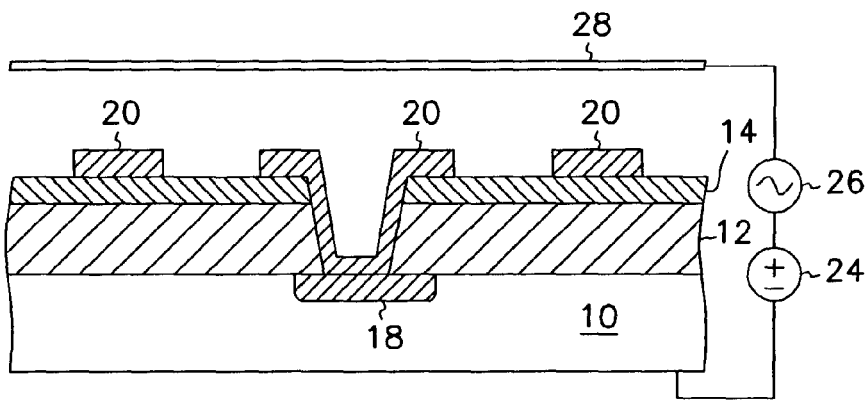

Portions of second layer 20 are selectively removed such that the remaining portions of second layer 20 match the desired pattern for the metallization layer, including contact vias. As shown in FIG. 1B, layer 22, comprising, for example, a conventional photoresist material, is formed outwardly from layer 20 using conventional techniques. Layer 22 is exposed through a mask. Portions of layer 22 are removed with a solvent so as to produce a patterned layer of photoresist material that matches the desired metallization layer. The exposed portions of layer 20 are removed with, for example, a dry etch leaving a patterned version of layer 20. Layer 22 is removed.

Once layer 20 is patterned, semiconductor substrate 10 is placed in an electrolytic bath for electro-deposition of the metallization layer outwardly from layer 20 so as to fill contact vias 16. The bath includes metal ions in a solution. For example, the metal ions may comprise copper ions in a solution as described in U.S. Pat. No. 5,151,168 entitled "Process for Metallizing Integrated Circuits With Electrically-Deposited Copper" (the "'168 Patent"), the teachings of which are incorporated by reference. Specifically, one embodiment of the electrolytic bath is described in the '168 Patent at Column 5, lines 10 through 35. Alternatively, the electrolytic bath may comprise a solution containing nickel or palladium ions.

Voltage source 26 provides a bipolar modulated voltage to anode 28 and voltage source 24 provides a DC offset voltage to anode 28. The voltage on anode 28 causes metal ions to be deposited on a layer when the potential difference between anode 28 and the surface potential of the layer exceeds the reduction potential of the metal. Conversely, the voltage on anode 28 causes metal ions to be removed from the surface of a layer when the potential difference between anode 28 and the surface potential of the layer is less than the reverse deposition potential of the metal. The voltages of sources 26 and 28 are selected such that metal deposited on layer 14 during a first duty cycle is removed during a second duty cycle. Further, metal is not removed from layer 20 during the second duty cycle. For example, in one embodiment source 26 provides a square wave with a dc offset provided by source 24 such that during the positive duty cycle of source 26, metal ions deposit on layers 14 and 20 and during the negative duty cycle copper is etched from layer 14. In other embodiments, source 26 comprises other time-varying wave-forms such as a triangle wave, sinusoidal wave or other appropriate voltage wave form.

Figure 1D:
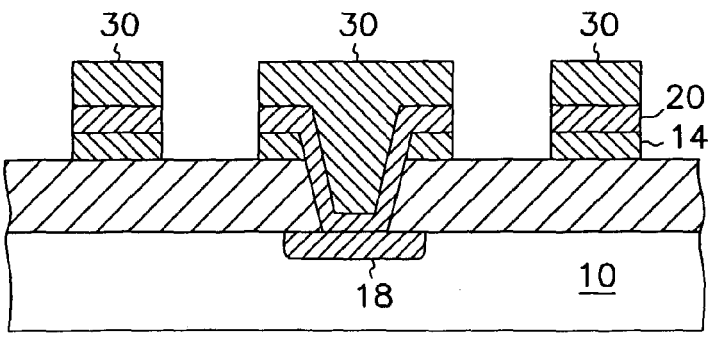
Figure 2:
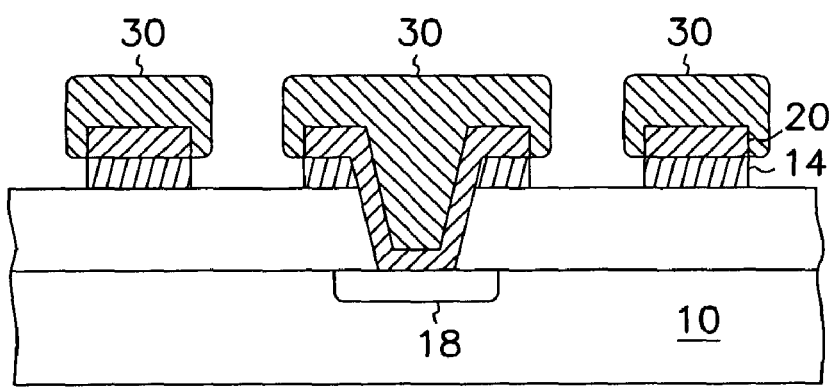
FIGS. 2 and 3 are cross-sectional views of additional illustrative embodiments of the present invention.

Once the deposition of metallization layer 30 is complete, exposed portions of first layer 14 are removed leaving the structure shown in FIG. 1D. In one embodiment, metallization layer 30 covers all of the exposed surfaces of layer 20 as shown in FIG. 2. It is understood that an integrated circuit constructed according to this process would include a complete metallization layer with a plurality of contact vias even though only portions of the metallization layer and a single contact via are shown in FIGS. 1A through 1D.

CONCLUSION

Figure 3:
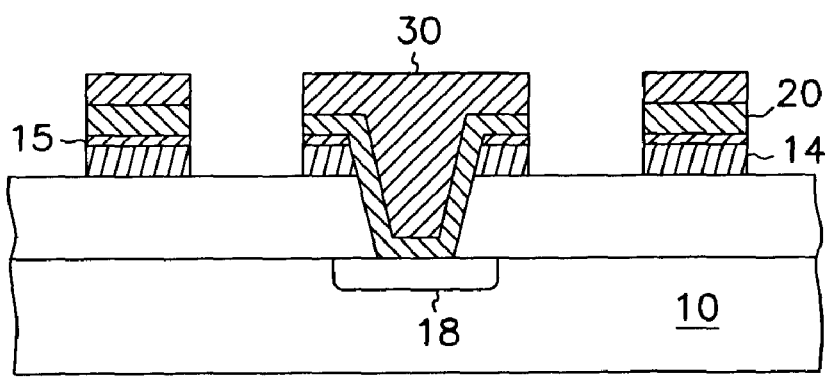

Although an illustrative embodiment has been described herein, it will be appreciated by those of ordinary skill in the art that any arrangement which is calculated to achieve the same purpose may be substituted for the specific embodiment shown. This application is intended to cover any adaptations or variations of the illustrative embodiment. For example, the type of modulated voltage can be varied from the specified square wave used in the illustrative embodiment. Further, the difference in surface potential between layers 14 and 20 can be imposed or enhanced by applying voltages to the surfaces of layers 14 and 20. In this embodiment, layers 14 and 20 are separated by insulating layer 15 as shown in FIG. 3. The composition of the electrolytic bath can be varied so long as metal ions deposit on layer 20 when sources 24 and 26 are applied to anode 28.

What is claimed is:

1. A semiconductor manufacturing system, comprising:
   an electrolytic bath containing metal ions;
   an anode; and
   a modulating voltage supply to provide a bipolar modulated voltage between a substrate of a semiconductor device and the anode in the presence of the electrolytic bath, and wherein the modulated voltage has a first duty cycle and a second duty cycle,
   wherein the metal ions are deposited on an exposed first layer of the semiconductor device and on a second layer of the semiconductor device during the first duty cycle, and
   wherein the metal ions are removed from the exposed first layer during the second duty cycle.

2. The semiconductor manufacturing system of claim 1, wherein the first layer has a first surface voltage and the second layer has a second surface voltage, and the first surface voltage is lower than the second surface voltage.

3. The semiconductor manufacturing system of claim 1, further comprising a voltage supply circuit to supply a first potential to the exposed first layer and a second potential to the second layer.

4. The semiconductor manufacturing system of claim 3, wherein the voltage supply circuit includes a first voltage supply to supply a first potential to the exposed first layer, and a second voltage supply to supply a second potential to the second layer.

5. The semiconductor manufacturing system of claim 1, wherein the electrolytic bath contains copper ions to form a copper metallization layer.

6. The semiconductor manufacturing system of claim 1, wherein the electrolytic bath contains nickel ions to form a nickel metallization layer.

7. The semiconductor manufacturing system of claim 1, wherein the electrolytic bath contains palladium ions to form a palladium metallization layer.

8. A semiconductor manufacturing system for forming a metallization layer on a semiconductor device having a substrate, a first layer of material on the substrate, and a patterned second layer of material on the first layer of material, the system comprising:
- an anode;
- an electrolytic bath of metal ions for the semiconductor device; and
- a modulating voltage supply to provide a bipolar modulating voltage between the anode and the substrate of the semiconductor device.

9. The semiconductor manufacturing system of claim 8, wherein the first material has a first potential and the second material has a second potential.

10. The semiconductor manufacturing system of claim 8, comprising a voltage supply circuit to provide a first potential to the first layer of material and a second potential to the second layer of material.

11. The semiconductor manufacturing system of claim 8, further comprising a DC offset voltage in series with the modulating voltage supply.

12. The semiconductor manufacturing system of claim 8, wherein the modulating voltage supply includes a square wave voltage supply.

13. The semiconductor manufacturing system of claim 8, wherein the modulating voltage supply includes a triangle wave voltage supply.

14. The semiconductor manufacturing system of claim 8, wherein the modulating voltage supply includes a sinusoidal wave voltage supply.

15. A semiconductor manufacturing system for forming a metallization layer on a semiconductor device having a substrate, a first layer of material on the substrate, and a patterned second layer of material on the first layer of material, the system comprising:
- an anode;
- a modulating voltage supply to provide a bipolar modulating voltage with a DC offset between the anode and the substrate of the semiconductor device; and
- an electrolytic bath of copper ions for the semiconductor device.

16. The semiconductor manufacturing system of claim 15, wherein the first material has a first potential and the second material has a second potential.

17. The semiconductor manufacturing system of claim 15, further comprising a voltage supply circuit to provide a first potential to the first layer of material and a second potential to the second layer of material.

18. The semiconductor manufacturing system of claim 15, wherein the modulating voltage supply includes a square wave voltage supply.

19. The semiconductor manufacturing system of claim 15, wherein the modulating voltage supply includes a triangle wave voltage supply.

20. The semiconductor manufacturing system of claim 15, wherein the modulating voltage supply includes a sinusoidal wave voltage supply.

21. A semiconductor manufacturing system for forming a metallization layer on a semiconductor device having a substrate, a first layer of material on the substrate, an insulator layer on the first layer of material, a patterned second layer of material on the insulator layer, the system comprising:
- an anode;
- a modulating voltage supply to provide a bipolar modulating voltage between the anode and the substrate of the semiconductor device;
- a circuit to provide a first potential on the first layer of material and a second potential on the second layer of material; and
- an electrolytic bath of metal ions for the semiconductor device.

22. The semiconductor manufacturing system of claim 21, wherein the metal ions include copper ions.

23. The semiconductor manufacturing system of claim 21, wherein the metal ions include nickel ions.

24. The semiconductor manufacturing system of claim 21, wherein the metal ions include palladium ions.

25. The semiconductor manufacturing system of claim 21, wherein:
- the bipolar modulating voltage has a first duty cycle and a second duty cycle; and
- metal ions are deposited on the first layer of material and the second layer of material during the first duty cycle, and are removed from the first layer of material during the second duty cycle.

26. A semiconductor manufacturing system for forming a metallization layer on a semiconductor device having a substrate, a first layer of material on the substrate, and a patterned second layer of material on the first layer of material, the system comprising:
- an anode;
- a circuit to provide a first potential on the first layer of material and a second potential on the second layer of material;
- an electrolytic bath of metal ions for the semiconductor device; and
- a modulating voltage supply to provide a bipolar modulating voltage with a DC offset between the anode and the substrate of the semiconductor device, the bipolar modulating voltage having a first duty cycle and a second duty cycle, wherein metal ions are deposited on the first layer of material and the second layer of material during the first duty cycle, and are removed from the first layer of material during the second duty cycle.

27. The semiconductor manufacturing system of claim 26, wherein the metal ions include copper ions.

28. The semiconductor manufacturing system of claim 26, wherein the metal ions include nickel ions.

29. The semiconductor manufacturing system of claim 26, wherein the metal ions include palladium ions.

30. A semiconductor manufacturing system, comprising:
- means for forming a first layer overlying a substrate;
- means for forming contact vias through the first layer to the substrate;
- means for forming a patterned second layer overlying the first layer and lining the contact vias; and
- means for forming a metallization layer, including means for applying a bipolar modulated voltage between the substrate and an anode in the presence of an electrolytic bath.

31. The semiconductor manufacturing system of claim 30, wherein the means for forming a metallization layer includes means for filling the contact vias.

32. The semiconductor manufacturing system of claim 30, further comprising means for applying a first potential to the first layer and a second potential to the second layer.

33. The semiconductor manufacturing system of claim 30, wherein the means for applying a bipolar modulated voltage between the substrate and an anode in the presence of an electrolytic bath includes means for providing a DC offset potential.

34. A semiconductor manufacturing system, comprising:
means for providing a semiconductor device having:
- a substrate;
- a first layer overlying the substrate; and
- a second layer overlying the first layer, wherein the device has an exposed first layer portion and an exposed second layer portion; and means for providing a bipolar modulated voltage between the substrate and an anode in the presence of an electrolytic bath containing metal ions,
wherein the modulated voltage has a first duty cycle and a second duty cycle;
wherein the metal ions are deposited on the exposed first layer portion and the exposed second layer portion during the first duty cycle; and
wherein the metal ions are removed from the exposed first layer portion during the second duty cycle.

35. The semiconductor manufacturing system of claim 34, further comprising means for applying a first potential to the first layer and a second potential to the second layer.

36. The semiconductor manufacturing system of claim 34, wherein the means for providing a bipolar modulated voltage includes providing a DC offset potential.

37. The semiconductor manufacturing system of claim 34, wherein the metal ions include copper ions.

38. The semiconductor manufacturing system of claim 34, wherein the metal ions include nickel ions.

39. The semiconductor manufacturing system of claim 34, wherein the metal ions include palladium ions.

* * * * *